(12) United States Patent
Oyamada

(10) Patent No.: US 10,833,028 B2
(45) Date of Patent: Nov. 10, 2020

(54) THIN-FILM CAPACITOR STRUCTURE AND SEMICONDUCTOR DEVICE INCLUDING THE THIN-FILM CAPACITOR STRUCTURE

(71) Applicant: Noda Screen Co., Ltd., Aichi (JP)

(72) Inventor: Seisei Oyamada, Komaki (JP)

(73) Assignee: NODA SCREEN CO., LTD., Aichi (JP)

( * ) Notice: Subject to any disclaimer, the term of this patent is extended or adjusted under 35 U.S.C. 154(b) by 0 days.

(21) Appl. No.: 16/603,934

(22) PCT Filed: May 17, 2017

(86) PCT No.: PCT/JP2017/018474
§ 371 (c)(1),
(2) Date: Oct. 9, 2019

(87) PCT Pub. No.: WO2018/211614
PCT Pub. Date: Nov. 22, 2018

(65) Prior Publication Data
US 2020/0126934 A1  Apr. 23, 2020

(51) Int. Cl.
*H01L 23/64* (2006.01)
*H01L 23/00* (2006.01)

(52) U.S. Cl.
CPC ............ *H01L 23/642* (2013.01); *H01L 24/11* (2013.01); *H01L 24/13* (2013.01); *H01L 24/14* (2013.01);
(Continued)

(58) Field of Classification Search
None
See application file for complete search history.

(56) References Cited

U.S. PATENT DOCUMENTS 6,885,541 B2   4/2005   Otsuka et al.
7,345,246 B2   3/2008   Muramatsu et al.
(Continued)

FOREIGN PATENT DOCUMENTS

JP   2005-033195   2/2005
JP   2005-123250   5/2005
(Continued)

OTHER PUBLICATIONS

International Search Report dated Aug. 1, 2017 in International (PCT) Application No. PCT/JP2017/018474.

*Primary Examiner* — Thien F Tran
(74) *Attorney, Agent, or Firm* — Wenderoth, Lind & Ponack, L.L.P.

(57) ABSTRACT

A thin-film capacitor structure (50) is joined to an electrode pad surface (2S) of an area array integrated circuit (2) having a plurality of electrode pads (3G, 3P, 3S) arranged in an area array on the electrode pad surface (2S). The thin-film capacitor structure (50) includes a thin-film capacitor (10) including a first sheet electrode (11), a second sheet electrode (13), and a thin-film dielectric layer (12) formed between the first sheet electrode (11) and the second sheet electrode (12), a first insulating film (21), a second insulating film (22), and a plurality of through holes (30P, 30G, 30S). The plurality of through holes (30P, 30G, 30S) are bored from the first insulating film (21) to the second insulating film (22) through the thin-film capacitor (10) and formed in positions corresponding to the plurality of electrode pads (3G, 3P, 3S).

6 Claims, 16 Drawing Sheets

(52) U.S. Cl.
CPC .... *H01L 24/16* (2013.01); *H01L 2224/13147* (2013.01); *H01L 2224/14051* (2013.01); *H01L 2224/16227* (2013.01)

(56) References Cited

U.S. PATENT DOCUMENTS

| | | |
|---|---|---|
| 7,973,245 B2 | 7/2011 | Muramatsu et al. |
| 9,761,544 B1 * | 9/2017 | Oyamada ................ H01L 27/04 |
| 2004/0264103 A1 | 12/2004 | Otsuka et al. |
| 2006/0175083 A1 | 8/2006 | Muramatsu et al. |
| 2007/0132088 A1 * | 6/2007 | Kariya .................... H01L 23/50 |
| | | 257/698 |
| 2008/0223607 A1 | 9/2008 | Muramatsu et al. |
| 2010/0044089 A1 | 2/2010 | Shibuya et al. |

FOREIGN PATENT DOCUMENTS

| | | |
|---|---|---|
| JP | 2007-184324 | 7/2007 |
| JP | WO2008/105496 | 9/2008 |
| TW | 200642541 | 12/2006 |

* cited by examiner

THIN-FILM CAPACITOR STRUCTURE AND SEMICONDUCTOR DEVICE INCLUDING THE THIN-FILM CAPACITOR STRUCTURE

TECHNICAL FIELD

The present invention relates to thin-film capacitor structures and semiconductor devices including the thin-film capacitor structures and, in particular, to a structure of a thin-film capacitor for reducing the impedance of a power supply circuit of an area array integrated circuit.

BACKGROUND ART

Conventionally, as an example of a thin-film capacitor of this type, a technology disclosed in PTL 1 has been known. PTL 1 discloses laminated capacitors that can be used as intermediate substrates and, in particular, a thin-film capacitor 10 that makes it possible to effectively eliminate a routed wiring part that causes an increase in inductance and, by extension, makes it possible to achieve a lower impedance and a wider bandwidth.

RELATED ART DOCUMENT

Patent Document

Patent Document 1: Japanese Unexamined Patent Application Publication No. 2005-33195

DISCLOSURE OF THE PRESENT INVENTION

Problem to be Solved by the Invention

The conventional thin-film capacitor 10 can form a thin-film capacitor that is compatible with an area array integrated circuit 2; however, as shown in FIGS. 1 and 4 and the like of PTL 1, the integrated circuit 2 and the thin-film capacitor 10 have their respective electrodes 14 and 17 connected to each other via terminals 5a and 5b of a terminal array 5 formed on top of the thin-film capacitor 10. This has made it necessary to form the terminal array 5 on top of the thin-film capacitor 10. Further, there has been concern about the influence on an increase in inductance by the terminals 5a and 5b of the terminal array 5 in a high-frequency region.

The present invention was made in view of the above circumstances. An object is to provide a capacitor structure that makes it possible to simplify a connecting configuration of a thin-film capacitor and an integrated circuit and makes it possible to reduce impedance pertaining to wiring of the thin-film capacitor and a semiconductor device including the capacitor structure.

Means for Solving the Problem

A thin-film capacitor structure disclosed herein is a thin-film capacitor structure that is joined to an electrode pad surface of an area array integrated circuit having a plurality of electrode pads, arranged in an area array in the electrode pad surface, that include power supply pads, ground pads, and signal pads, the thin-film capacitor structure including: a thin-film capacitor including a first sheet electrode, a second sheet electrode, and a thin-film dielectric layer formed between the first sheet electrode and the second sheet electrode; a first insulating film that insulated the first sheet electrode; a second insulating film that insulates the second sheet electrode; and a plurality of through holes, bored from the first insulating film to the second insulating film through the thin-film capacitor and formed in positions corresponding to the plurality of electrode pads, that include power supply through holes formed in positions corresponding to the power supply pads, ground through holes formed in positions corresponding to the ground pads, and signal through holes formed in positions corresponding to the signal pads.

According to the present configuration, the plurality of through holes are provided that are bored from the first insulating film to the second insulating film through the thin-film capacitor and formed in positions corresponding to the plurality of electrode pads. Therefore, in joining the thin-film capacitor to the area array integrated circuit, the thin-film capacitor can be joined to the area array capacitor by filling the plurality of through holes with a conductive member such as a copper paste up to the electrode pads. This eliminates the need to form a terminal array on top of the thin-film capacitor or form connection bumps on the electrode pads of the area array integrated circuit. Further, the thin-film capacitor can be bonded to the electrode pad surface of the area array integrated circuit by nearly the most direct way. This as a result makes it possible to simplify a connecting configuration of the thin-film capacitor and the integrated circuit and makes it possible to reduce impedance pertaining to wiring of the thin-film capacitor.

In the thin-film capacitor structure, the first sheet electrode may include first overhangs that hang over into the ground through holes, first openings formed in positions corresponding to the power supply pads and the signal pads, and ground pad openings, formed in positions corresponding to the ground pads, that have therearound planar shapes forming the first overhangs, and the second sheet electrode may include second overhangs that hang over into the power supply through holes, second openings formed in positions corresponding to the ground pads and the signal pads, and power supply pad openings, formed in positions corresponding to the power supply pads, that have therearound planar shapes forming the second overhangs.

According to the present configuration, in filling the plurality of through holes with a conductive member such as a copper paste to the electrode pads, the first overhangs and the second overhangs increase the area of a joint that the conductive member forms with the first sheet electrode and the second sheet electrode. This allows the conductive member to form a stronger joint with the first sheet electrode and the second sheet electrode, thereby improving the reliability of a joint between the conductive member and each of the sheet electrodes. Further, the power supply through holes, the ground through holes, and the signal through holes can be formed by the openings. Further, the ground pad openings and the power supply pad openings make it possible to form the first overhangs and the second overhangs, respectively, in a simple configuration.

Further, in the thin-film capacitor structure, the thin-film dielectric layer may include dielectric openings, formed in positions corresponding to the plurality of electrode pads, that have opening areas which are smaller than those of the first openings and the second openings, the first insulating film may include first insulating film openings formed in positions corresponding to the plurality of electrode pads, the second insulating film may include second insulating film openings formed in positions corresponding to the plurality of electrode pads, each of the power supply through holes may be constituted by a corresponding one of the first insulating film openings, a corresponding one of the dielectric openings, a corresponding one of the power supply pad openings, and a corresponding one of the second insulating film openings, each of the ground through holes may be constituted by a corresponding one of the first insulating film openings, a corresponding one of the ground pad openings, and a corresponding one of the second insulating film openings, and each of the signal through holes may be constituted by a corresponding one of the first insulating film openings, a corresponding one of the dielectric openings, and a corresponding one of the second insulating film openings.

The present configuration makes it possible to form the power supply through holes, the ground through holes, and the signal through holes by the openings while insulating a portion of the first sheet electrode and a portion of the second sheet electrode.

Further, in the thin-film capacitor structure, the first openings, the second openings, and the dielectric openings may have square shapes in a plan view, and the power supply pad openings and the ground pad openings may have cross shapes in a plan view.

The present configuration makes it possible to simplify the shape of a mask for forming each of the openings, thus making it possible to simplify the formation of each of the openings.

Further, a semiconductor device disclosed herein includes: an area array integrated circuit; a thin-film capacitor structure according to any of the above, the thin-film capacitor structure being joined to an electrode pad surface of the area array integrated circuit; and an electric conducting material filling the power supply through holes, the ground through holes, and the signal through holes up to the plurality of electrode pads.

The present configuration makes it possible to simplify a connecting configuration of the thin-film capacitor and the area array integrated circuit and makes it possible to reduce impedance pertaining to wiring of the thin-film capacitor.

The semiconductor device may further include connection pads for use in external connection, the connection pads being provided on a side of the electric conducting material opposite to the electrode pads.

According to the present configuration, for example, by forming solder microbumps on the connection pads, an area array semiconductor device including a thin-film capacitor can be build, and the semiconductor device can be connected to an external circuit.

The semiconductor device may further include an intermediate substrate, provided on a side of the thin-film capacitor structure opposite to the electrode pad surface, that has a plurality of intermediate substrate pads in positions corresponding to the plurality of electrode pads.

The present configuration makes it possible to change the pitch between electrode pads of the area array integrated circuit by providing the intermediate substrate with a rewiring layer. This makes it possible to connect the semiconductor device to an external circuit board with an electrode pitch that is different from the electrode pitch of the integrated circuit, e.g. to a motherboard.

Advantageous Effect of the Invention

The present invention makes it possible to simplify a connecting configuration of a thin-film capacitor and an integrated circuit and makes it possible to reduce impedance pertaining to wiring of the thin-film capacitor.

MODES FOR CARRYING OUT THE INVENTION

Embodiment

Figure 1:
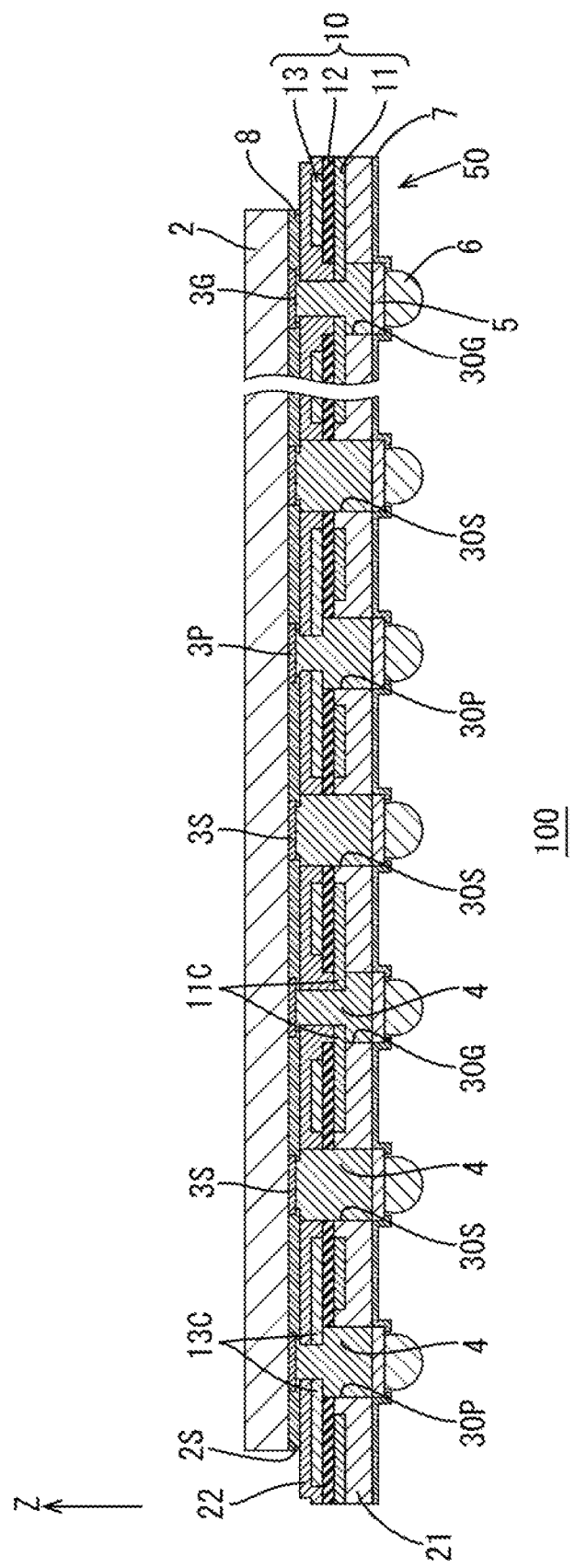
FIG. 1 is a schematic cross-sectional view showing a semiconductor device according to an embodiment.

An embodiment is described with reference to FIGS. 1 to 11. It should be noted that in the drawings, identical signs represent identical or equivalent portions. Further, the direction of the arrow Z in FIG. 1 is an upward direction. It should be noted that in a cross-sectional view such as FIG. 1, the dimension of a thin-film portion in a thickness direction is enlarged for convenience of explanation. Therefore, the dimensions of the cross-sectional view in a vertical direction are different from actual dimensions.

1. Configuration of Semiconductor Device

As shown in FIG. 1, a semiconductor device 100 roughly includes an LSI chip (which is an example of an "area array integrated circuit") 2 and a thin-film capacitor structure 50. It should be noted that FIG. 1 is a cross-sectional view of the semiconductor device 100 corresponding to a position indicated by a dot-and-dash line A-A in FIG. 7.

Figure 2:
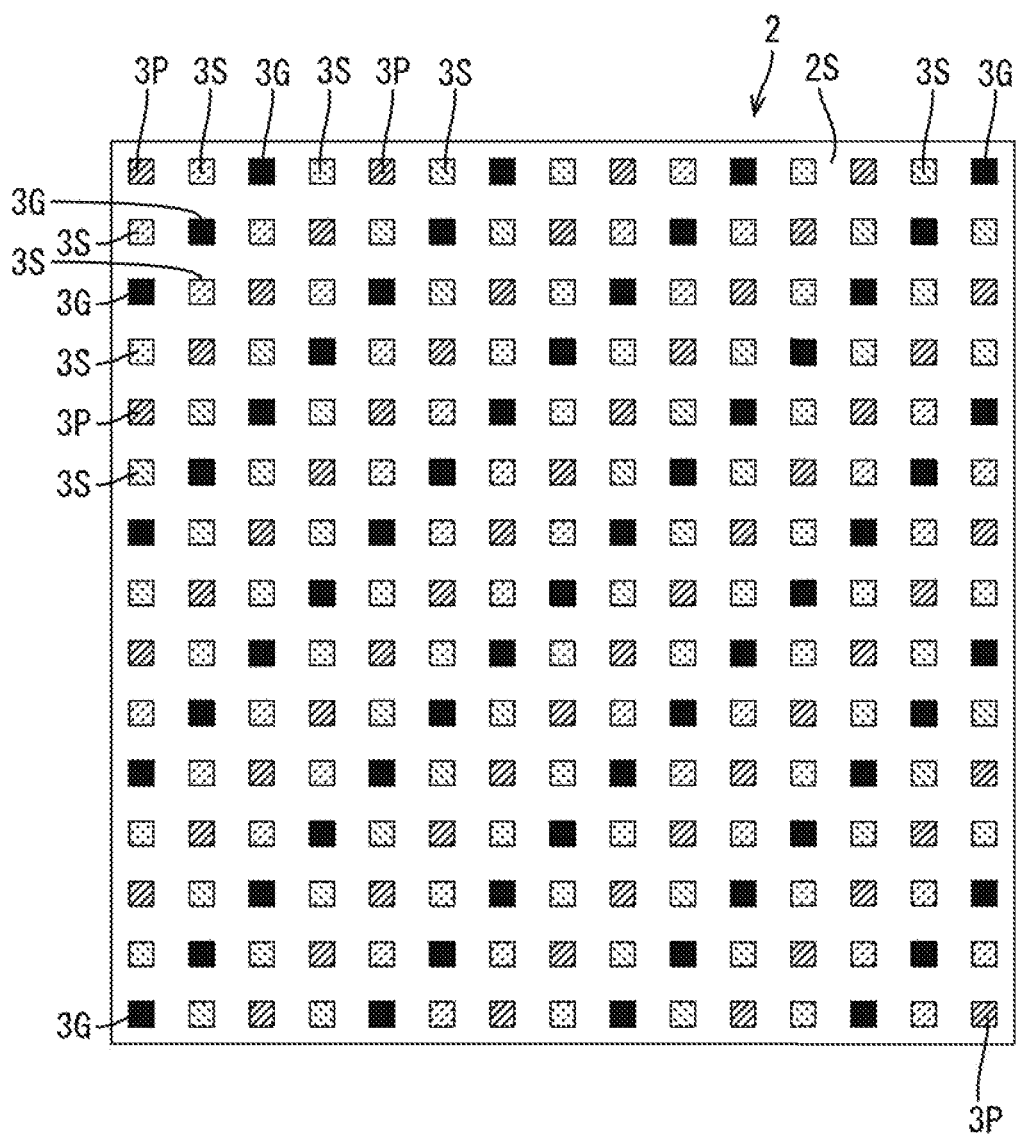
FIG. 2 is a plan view showing an electrode pad surface of the semiconductor device.

The LSI chip 2 has an electrode pad surface 2S serving as a bonding surface with a plurality of electrode pads 3 formed in an area array in the electrode pad surface 2S as shown in FIG. 2. The plurality of electrode pads 3 include power supply pads 3P, ground pads 3G, and signal pads 3S. To the power supply pads 3P, a high-tension side voltage, e.g. a voltage of 5 V, is applied via the thin-film capacitor structure 50, and to the ground pads 3G, a low-tension side voltage, e.g. a voltage of 0 V, is applied via the thin-film capacitor structure 50. Further, control signals or other signals are inputted and outputted via the signal pads 3S. As shown in FIG. 2, the power supply pads 3P, the ground pads 3G, and the signal pads 3S are dispersed almost everywhere in the electrode pad surface 2S. Each of the electrode pads 3 is isolated by a protective film 8. It should be noted that in a case where it is not necessary to distinguish among the power supply pads 3P, the ground pads 3G, and the signal pads 3S in the description, they are simply referred to as "electrode pads 3". In the present embodiment, each of the electrode pads 3 has a size of, for example, approximately 50 µm per side, and the electrode pads 3 are arranged at pitches of, for example, approximately 150 µm.

Further, as shown in FIG. 1, the thin-film capacitor structure 50, which will be described later, has (through holes 30G, 30P, and 30S) each filled with an electrical conducting material 4, e.g. a copper paste. Connection pads 5 for use in external connection is provided on a side of the electrical conducting material 4 opposite to the electrode pads 3, i.e. on a lower side of the electrical conducting material 4.

2. Configuration of Thin-Film Capacitor Structure

AS shown in FIG. 1, the thin-film capacitor structure 50 roughly includes a thin-film capacitor 10, a first insulating film 21, and a second insulating film 22.

The thin-film capacitor 10 includes a ground electrode (which is an example of a "first sheet electrode") 11 that is connected to the ground (low-voltage potential), a power supply electrode (which is an example of a "second sheet electrode") 13 that is connected to a power supply (high-voltage potential), and a thin-film dielectric layer 12 formed between the ground electrode 11 and the power supply electrode 13.

Figure 3:
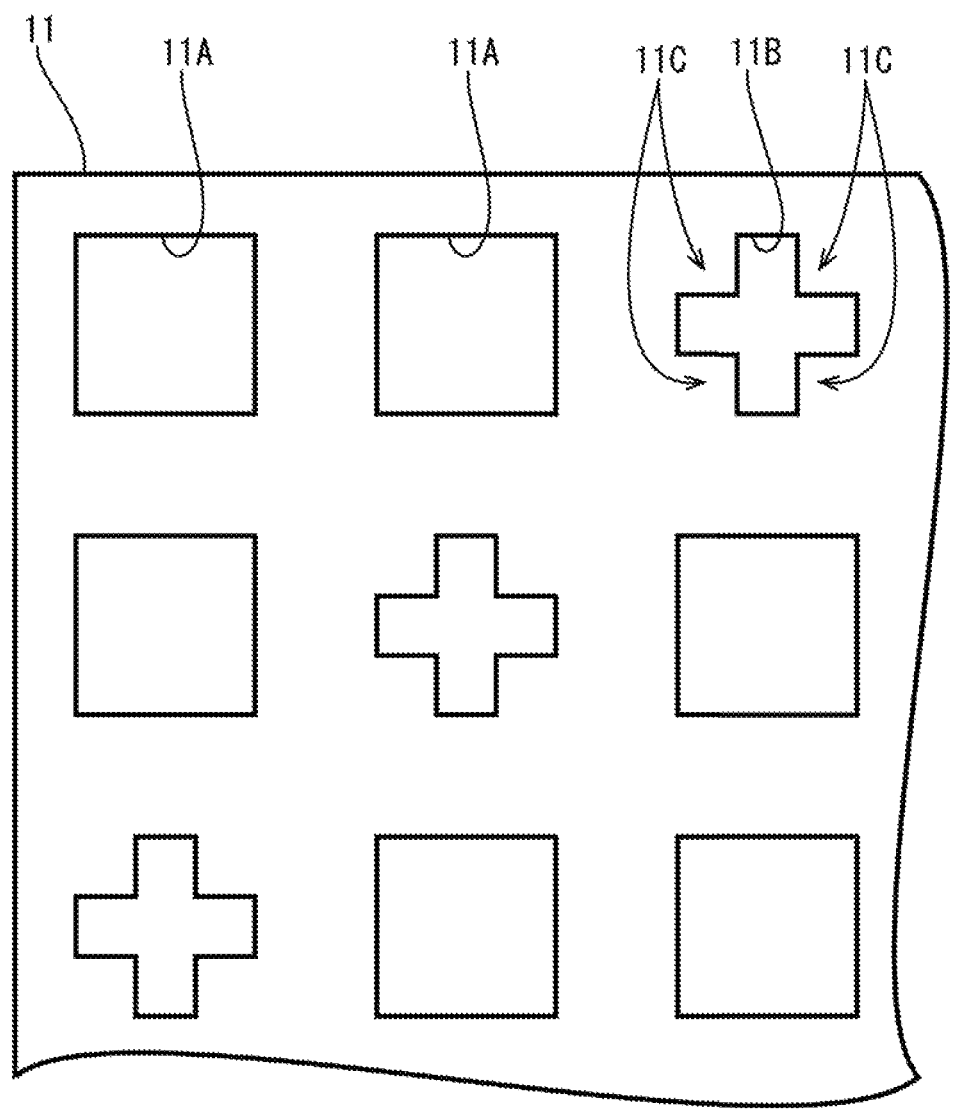
FIG. 3 is a partial plan view of a ground electrode of a thin-film capacitor.

The ground electrode 11 is a thin-film metal electrode and, as shown in FIG. 3, includes first openings 11A and ground pad openings 11B. The first openings 11A are formed in positions corresponding to the power supply pads 3P and the signal pads 3S. The ground pad openings 11B are formed in positions corresponding to the ground pads 3G and have therearound planar shapes forming overhangs 11C that partially cover the after-mentioned ground through holes 30G. In the present embodiment, as shown in FIG. 3, the first openings 11A have square shapes in a plan view, and the ground pad opening 11B have cross shapes in a plan view. Each of the ground pad openings 11B has a cross part adjacent to four overhangs 11C of the ground electrode 11 that partially cover a corresponding one of the ground through holes 30G, i.e. overlap the ground through hole 30G. Note here that the four overhangs 11C are an example of a "first overhang" that hangs over into a ground through hole 30G.

Figure 4:
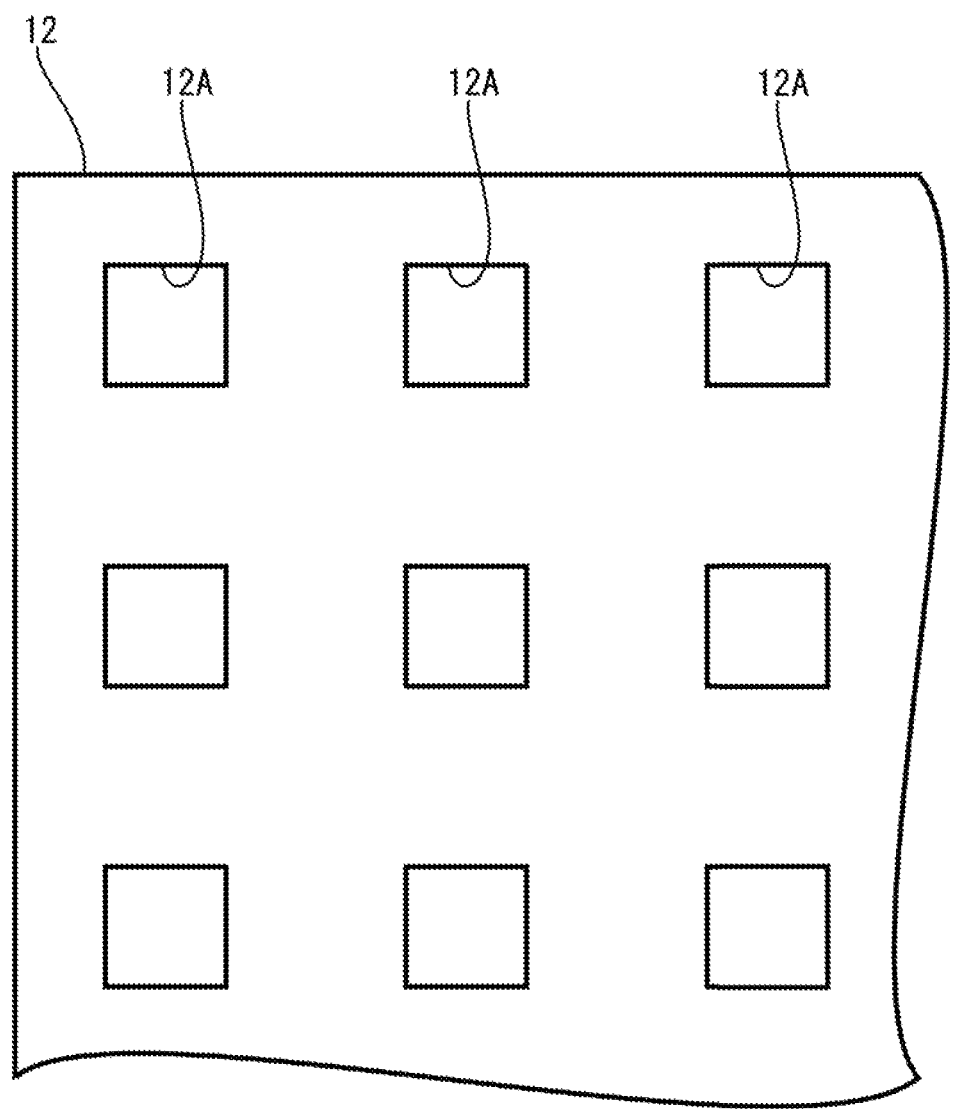
FIG. 4 is a partial plan view of a thin-film dielectric layer of the thin-film capacitor.

As shown in FIG. 4, the thin-film dielectric layer 12 includes dielectric openings 12A formed in positions corresponding to the plurality of electrode pads 3, i.e. positions corresponding to the power supply pads 3P, the ground pads 3G, and the signal pads 3S. In the present embodiment, the dielectric openings 12A have square shapes in a plan view and have opening areas which are smaller than those of the aforementioned first openings 11A and the after-mentioned second openings 13A.

Figure 5:
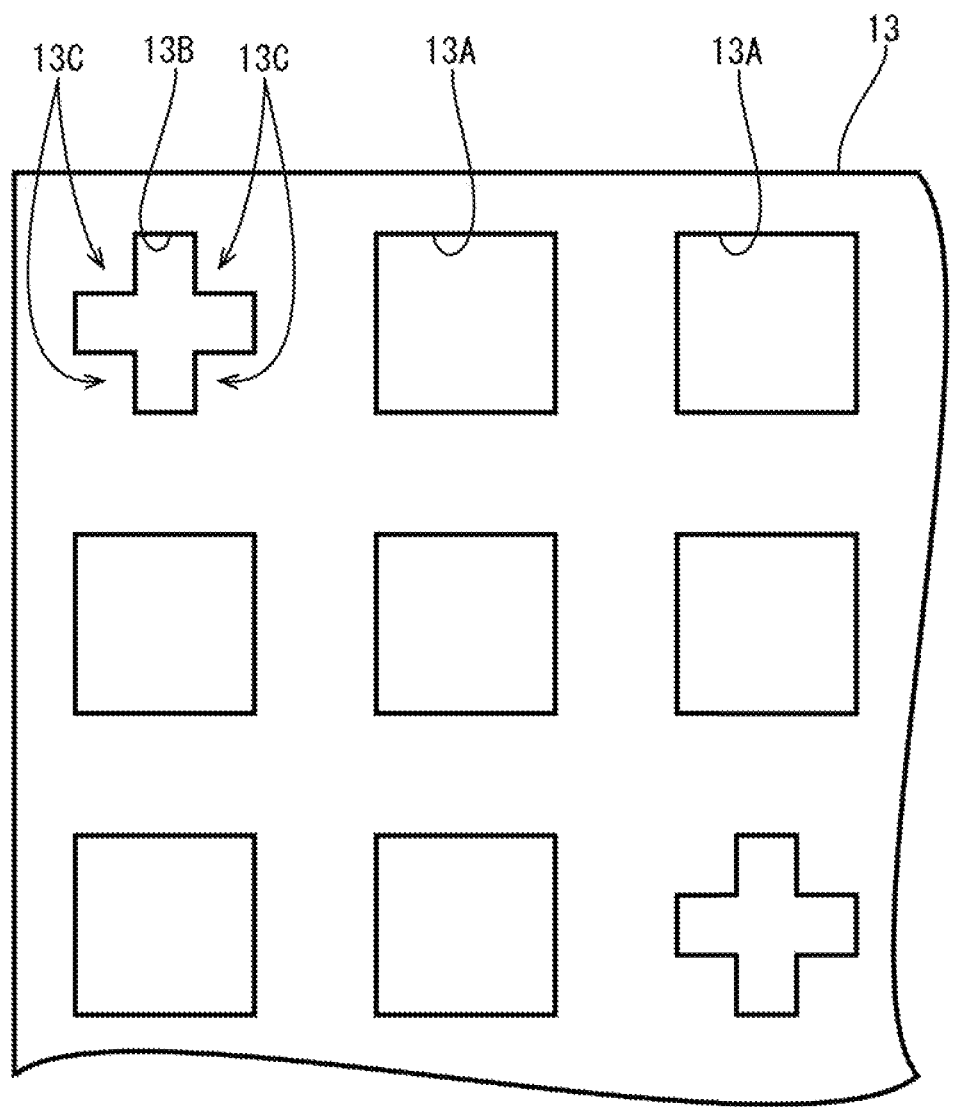
FIG. 5 is a partial plan view of a power supply electrode of the thin-film capacitor.
Figure 6:
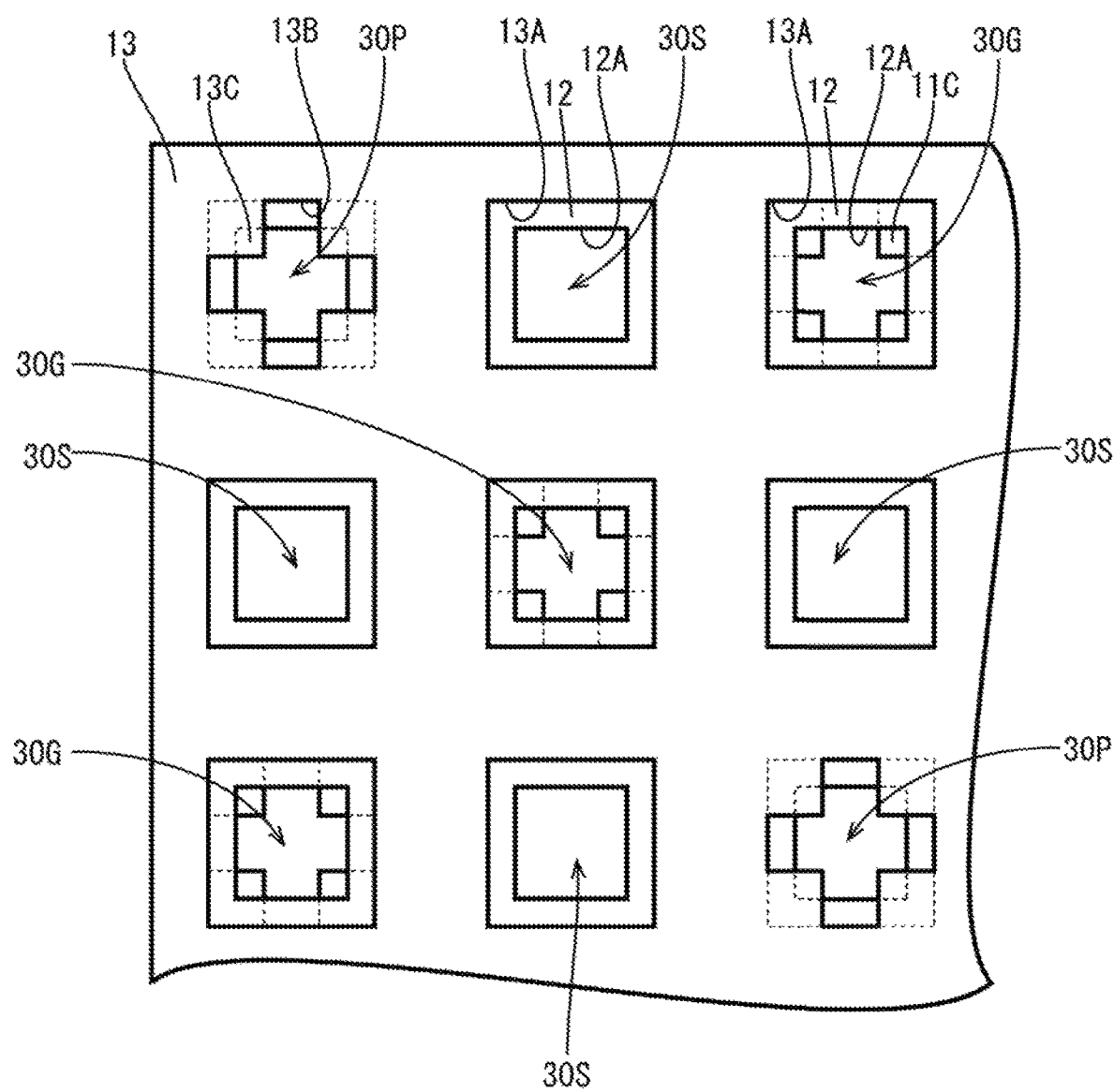
FIG. 6 is a partial plan view of the thin-film capacitor.
Figure 7:
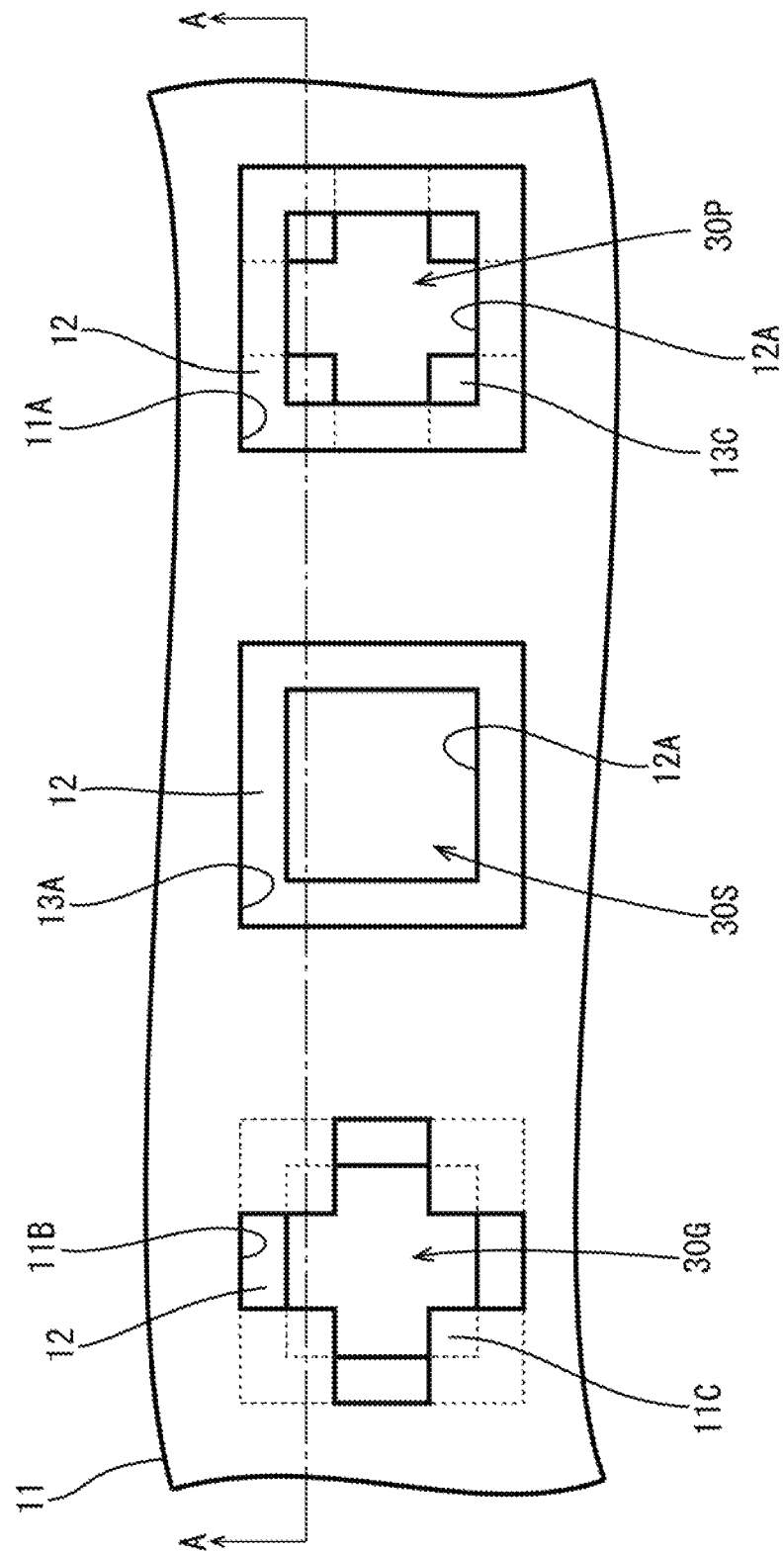
FIG. 7 is an partially enlarged view of FIG. 6.

The power supply electrode 13 is a thin-film metal electrode and, as shown in FIG. 5, includes second openings 13A and power supply pad openings 13B. The second openings 13A are formed in positions corresponding to the ground pads 3G and the signal pads 3S. The power supply pad openings 13B are formed in positions corresponding to the power supply pads 3P and have therearound planar shapes forming overhangs 13C. In the present embodiment, as shown in FIG. 5, the second openings 13A have square shapes in a plan view as is the case with the first openings 11A, and the power supply pad openings 13B have cross shapes in a plan view as is the case with the ground pad openings 11B. Each of the power supply pad openings 13B has a cross part adjacent to four overhangs 13C of the power supply electrode 13 that partially cover a corresponding one of the after-mentioned power supply through holes 30P, i.e. overlap the power supply through hole 30P. Note here that the four overhangs 13C are an example of a "second overhang" that hangs over into a power supply through hole 30P.

The first insulating film 21 insulates the ground electrode 11. The first insulating film 21 includes first insulating film openings 21A (see FIG. 8) formed in positions corresponding to the plurality of electrode pads 3, i.e. positions corresponding to the power supply pads 3P, the ground pads 3G, and the signal pads 3S. It should be noted that FIG. 8 is a cross-sectional view corresponding to a position indicated by the dot-and-dash line A-A in FIG. 7.

The second insulating film 22 insulates the power supply electrode 13. Further, as is the case with the first insulating film 21, the second insulating film 22 includes second insulating film openings 22A (see FIG. 8) formed in positions corresponding to the plurality of electrode pads 3, i.e. positions corresponding to the power supply pads 3P, the ground pads 3G, and the signal pads 3S.

Further, the thin-film capacitor structure 50 includes a plurality of through holes (30P, 30G, and 30S) bored from the first insulating film 21 to the second insulating film 22 through the thin-film capacitor 10 and formed in positions corresponding to the plurality of electrode pads 3. The plurality of through holes (30P, 30G, and 30S) include power supply through holes 30P formed in positions corresponding to the power supply pads 3P, ground through holes 30G formed in positions corresponding to the ground pads 3G, and signal through holes 30S formed in positions corresponding to the signal pads 3S (see FIGS. 6, 7, and 8).

Figure 8:
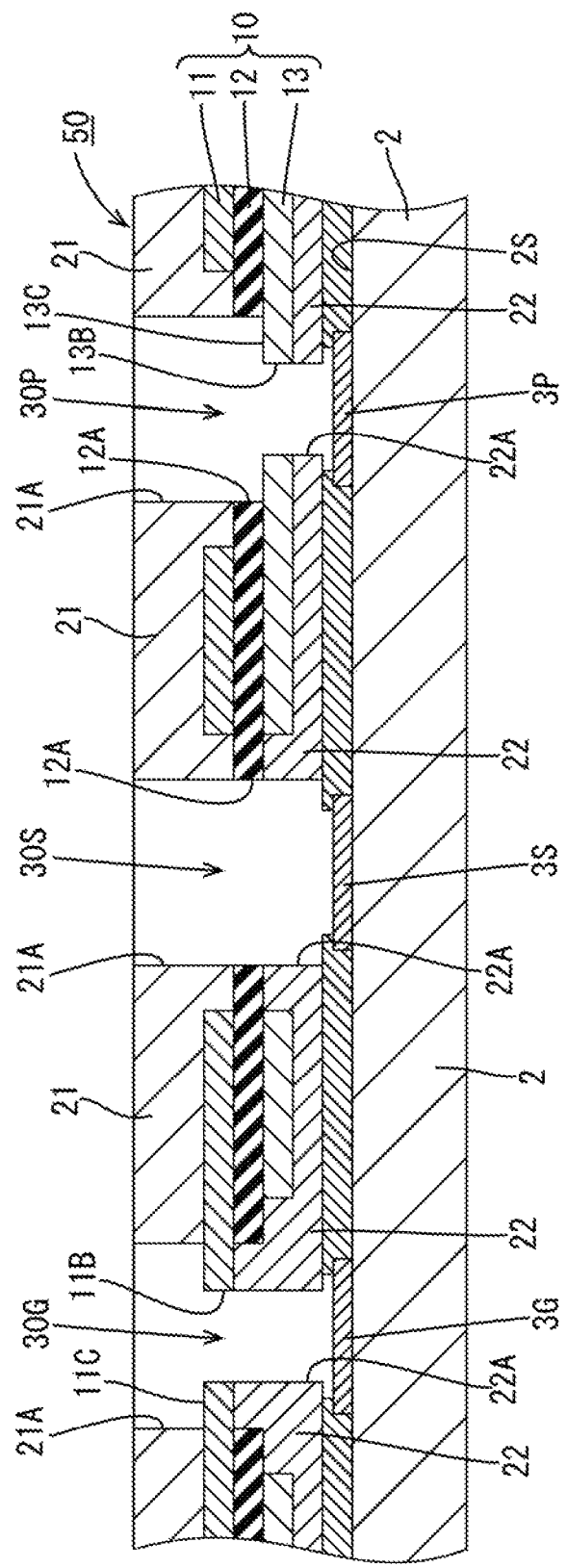
FIG. 8 is a cross-sectional view of a thin-film capacitor structured joined to an LSI chip.

In particular, as shown in FIG. 8, each of the power supply through holes 30P is constituted by a corresponding one of the first insulating film openings 21A, a corresponding one of the dielectric openings 12A, a corresponding one of the power supply pad openings 13B, and a corresponding one of the second insulating film openings 22A. Further, each of the ground through holes 30G is constituted by a corresponding one of the first insulating film openings 21A, a corresponding one of the ground pad openings 11B, and a corresponding one of the second insulating film openings 22A. Further, each of the signal through holes 30S is constituted by a corresponding one of the first insulating film openings 21A, a corresponding one of the dielectric openings 12A, and a corresponding one of the second insulating film openings 22A. It should be noted that the foregoing configuration is not intended to limit the configuration of openings that constitute each of the through holes (30G, 30P, and 30S).

3. Method for Manufacturing Semiconductor Device (Thin-Film Capacitor Structure)

Figure 9:
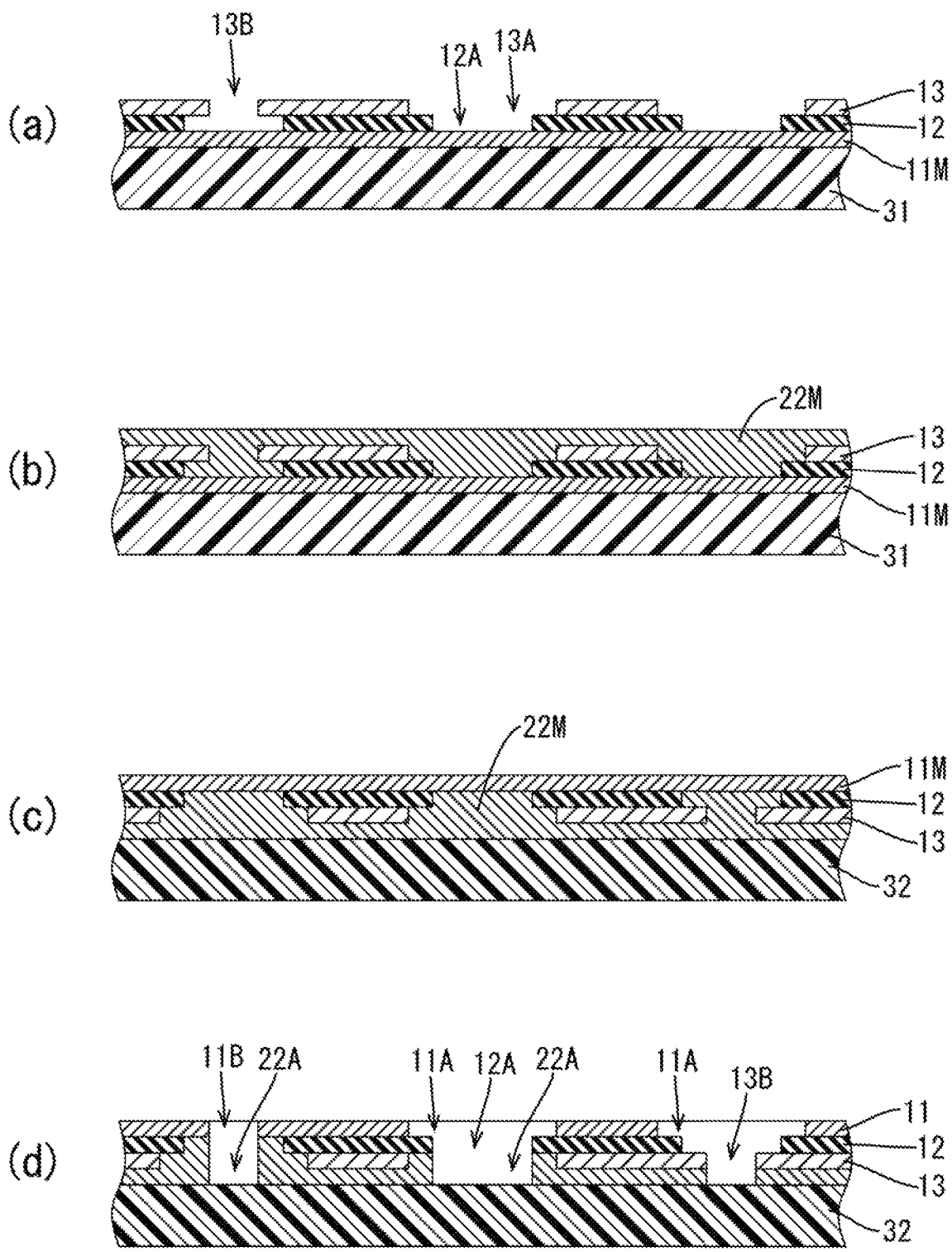
FIG. 9 is a schematic partial cross-sectional view showing a method for manufacturing a semiconductor device (thin-film capacitor structure).
Figure 10:
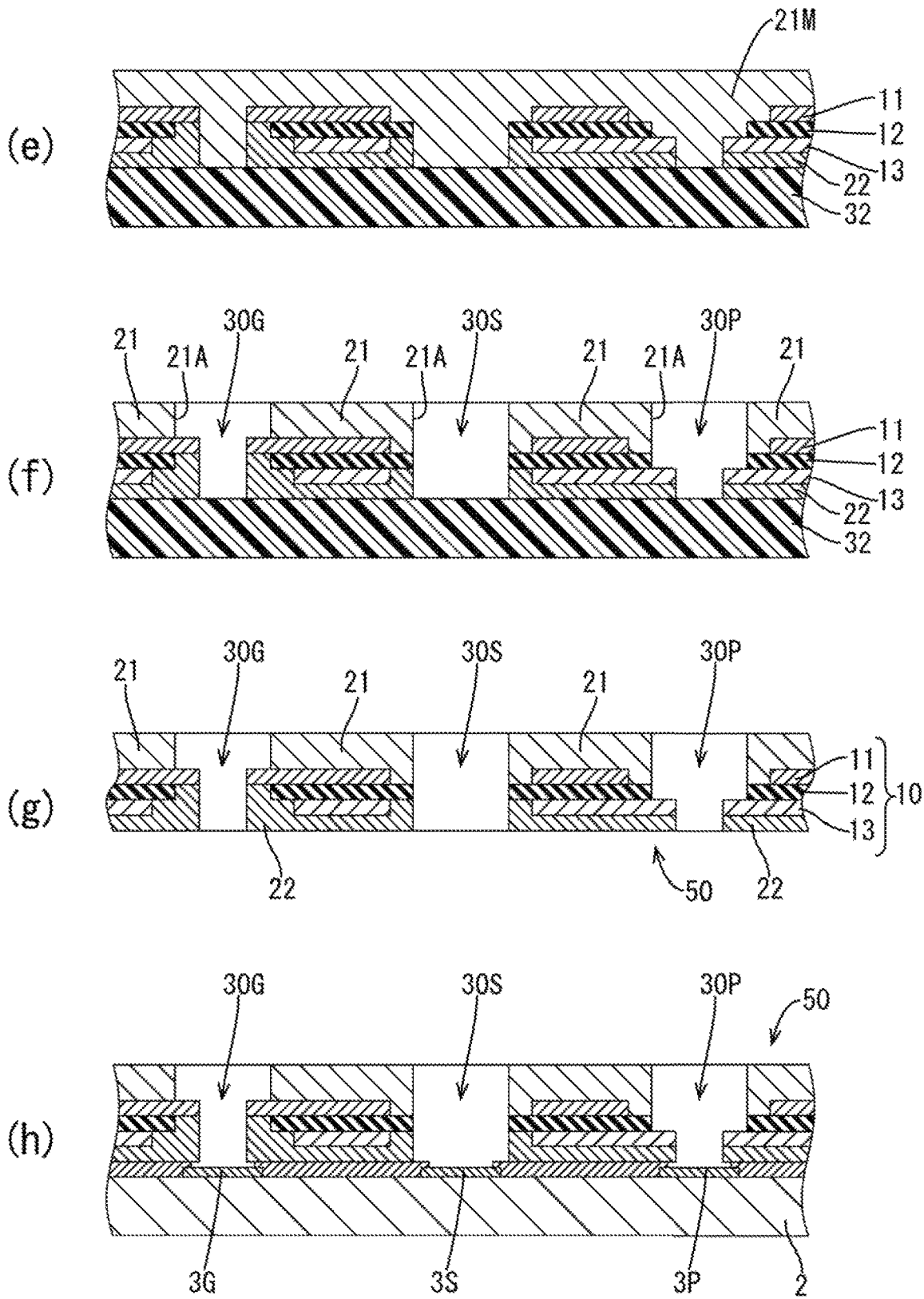
FIG. 10 is a schematic partial cross-sectional view showing the method for manufacturing a semiconductor device (thin-film capacitor structure).
Figure 11:
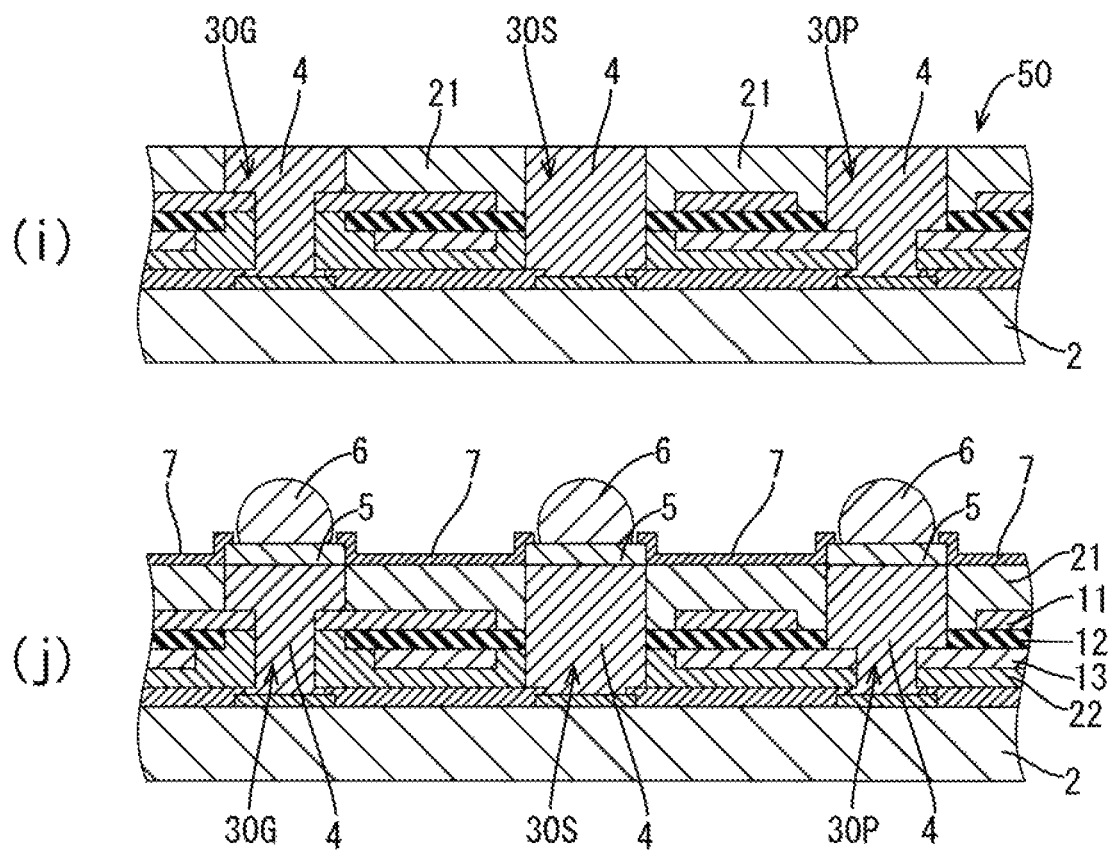
FIG. 11 is a schematic partial cross-sectional view showing the method for manufacturing a semiconductor device.

Next, an example of a method for manufacturing a semiconductor device 100 is described with reference to FIGS. 9 to 11. It should be noted that of the method for manufacturing a semiconductor device 100, FIGS. 9(a) to 10(g) show a method for manufacturing a thin-film capacitor structure 50. Further, FIGS. 9(c) to 11(j) are drawn with the upper part of FIG. 1 down. Further, the order of manufacturing steps shown in FIGS. 9 to 11 is just an example and is not intended to impose any limitation.

In the manufacturing method, first, the ground electrode 11, the thin-film dielectric layer 12, and the power supply electrode 13, which are in a solid state with no openings formed therein, are stacked in this order from the bottom on top of a support substrate 31, such as an ABF (Ajinomoto build-up film), that has adhesiveness and curability (not illustrated). Note here that the ground electrode 11 and the power supply electrode 13 are constituted, for example, by copper foil and the thin-film dielectric layer 12 is constituted, for example, by a STO (strontium titanate) film. In this state, the power supply electrode 13 is selectively etched so that openings (13A and 13B) are formed in the power supply electrode 13. After that, the dielectric openings 12A are formed in the thin-film dielectric layer 12 by laser processing, plasma dry etching, or solvent wet etching. This state is shown in FIG. 9(a).

Next, an organic insulating sheet 22M, made of epoxy resin, polyimide resin, or the like, that has adhesiveness and curability is placed on top of the power supply electrode 13 and subjected to thermocompression bonding. This state is shown in FIG. 9(b). As shown in FIG. 9(b), the organic insulating sheet 22M fills the dielectric openings 12A and the second openings 13A by thermocompression bonding and reaches a solid ground electrode 11M.

Next, the support substrate 31 is removed, and a half-processed article from which the support substrate 31 has been removed is turned upside down and fixed onto a new support substrate 32, such as an ABF, that has adhesiveness and curability. This state is shown in FIG. 9(c).

Next, the solid ground electrode 11M is selectively etched so that openings (11A and 11B) are formed, and the organic insulating sheet 22M is etched back so that the second insulating film 22 and the second insulating film openings 22A are formed. This state is shown in FIG. 9(d).

Next, as shown in FIG. 10(e), a resist film or the like is applied onto the ground electrode 11 and the like as an insulating film 21M that is to become the first insulating film 21. Next, the insulating film 21M is selectively etched so that, as shown in FIG. 10(f), the power supply through holes 30P, the ground through holes 30G, and the signal through holes 30S are formed. Next, the support substrate 32 is removed, whereby a thin-film capacitor structure 50 such as that shown in FIG. 10(g) is completed.

Next, as shown in FIG. 10(h), the thin-film capacitor structure 50 is joined to the electrode pad surface 2S of the LSI chip 2. The joint is formed by using an adhesive member (not illustrated), such as a DAF (die attach film) or an NCF (non-conductive film), that is thin and has adhesiveness. Alternatively, the joint may be formed by applying flux that does not require washing and utilizing the slight adhesiveness of the flux. Furthermore, in a case where the second insulating film 22 is a member that has a temporary bonding and permanent bonding function, the adhesive member may be replaced by the second insulating film 22.

Note here that the ground electrode 11 and the power supply electrode 13 are formed to be maintained almost entirely parallel to the electrode pad surface 2S of the LSI chip 2 and be able to make contact with the surface during filling of a conductive paste (such as a copper paste) by a squeegee or the like. This makes it possible to achieve a larger junction area, a lower contact resistance, and improved junction reliability in joining the thin-film capacitor structure 50 to the electrode pad surface 2S of the LSI chip 2.

Next, as shown in FIG. 11(i), the power supply through holes 30P, the ground through holes 30G, and the signal through holes 30S are filled, for example, with a curable copper paste 4 as an electrical conducting material by using a squeegee or the like, and the copper paste 4 is cured. In so doing, each segment of the copper paste 4 is electrically connected to a corresponding one of the electrode pads 3.

Next, as shown in FIG. 11(j), the external connection pads 5 for use in external connection for connecting to a circuit board such as an interposer substrate are formed in positions on the copper paste 4 corresponding to the power supply through holes 30P, the ground through holes 30G, and the signal through holes 30S. Next, the protective film 7, such as a solder resist, is formed in places excluding places where the external connection pads 5 are formed, and micro-solder balls 6 are attached to the external connection pads 5. As a result, a semiconductor device 100 such as that shown in FIG. 1 is completed.

4. Effects of the Embodiment

As noted above, the thin-film capacitor structure 50 of the present embodiment is provided with a plurality of through holes (30G, 30P, and 30S) bored from the first insulating film 21 to the second insulating film 22 through the thin-film capacitor 10 and formed in positions corresponding to a plurality of electrode pads (3G, 3P, and 3S). Therefore, in joining the thin-film capacitor structure 50, i.e. the thin-film capacitor 10, to the LSI chip 2 (area array integrated circuit), the thin-film capacitor 10 can be joined to the LSI chip 2, for example, by filling the plurality of through holes (30G, 30P, and 30S) the conductive member 4 such as a copper paste up to the electrode pads 3. This eliminates the need to form a terminal array on top of the thin-film capacitor 10 or form connection bumps on the electrode pads 3 of the LSI chip 2. Further, the thin-film capacitor 10 can be bonded to the electrode pad surface 2S of the LSI chip 2 by nearly the most direct way. This as a result makes it possible to simplify a connecting configuration of the thin-film capacitor 10 and the LSI chip 2 (integrated circuit) and makes it possible to reduce impedance pertaining to wiring of the thin-film capacitor 10.

Further, in filling the plurality of through holes 30 with the conductive member 4 such as a copper paste up to the electrode pads 3, the overhangs 11C of the ground electrode 11 and the overhangs 13C of the power supply electrode 13 increase the area of a joint that the conductive member 4 forms with the ground electrode 11 and the power supply electrode 13. This allows the conductive member 4 to form a stronger joint with the ground electrode 11 and the power supply electrode 13 and results in improved reliability of a joint between the conductive member 4 and each of the electrodes (11 and 12).

In so doing, the overhangs 11C are formed along with the formation of the cross-shaped ground pad openings 11B, and the second overhangs 13C are formed along the formation of the cross-shaped power supply pad openings 13B. This makes it possible to form the first overhangs 11C and the second overhangs 13C in a simple way.

Further, the first openings 11A, the second opening 13A, and the dielectric opening 12A have square shapes in a plan view, and the power supply pad openings 13B and the ground pad openings 11B have cross shapes in a plan view. This makes it possible to simplify the shape of a mask for forming each of the openings, thereby simplifying the formation of each of the openings. Further, the first overhangs 11C and the second overhangs 13C can be simultaneously formed along with the formation of the ground pad openings 11B and the power supply pad openings 13B.

Other Embodiment

The present invention is not limited to the embodiments described above with reference to the drawings. The following embodiments may be included in the technical scope of the present invention.

Figure 12:
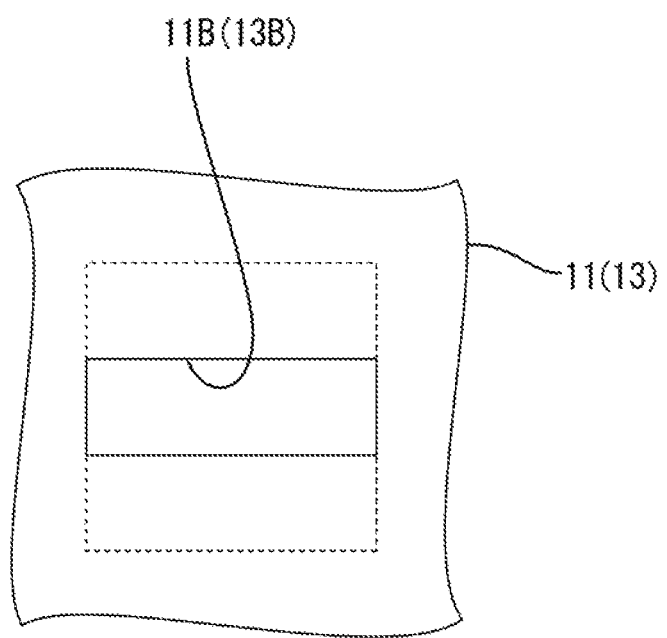
FIG. 12 is a schematic plan view showing another example of a ground pad opening.
Figure 13:
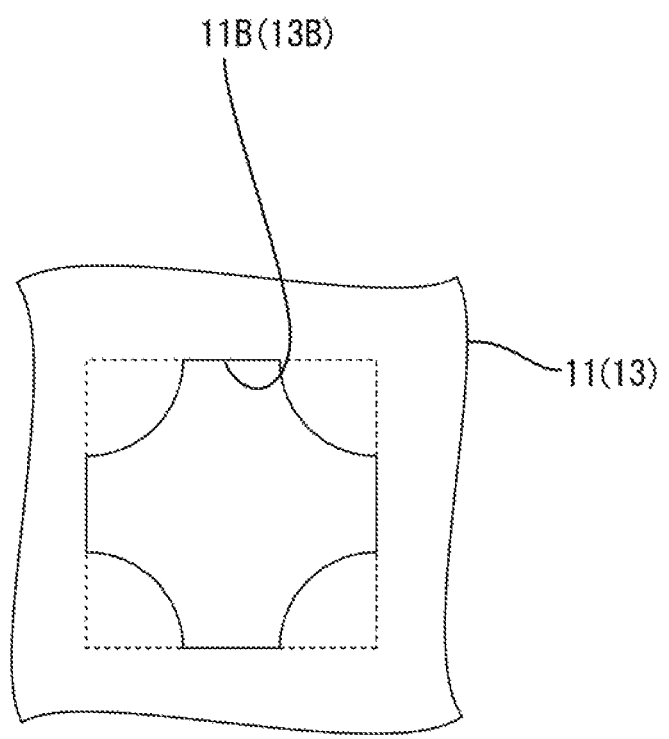
FIG. 13 is a schematic plan view showing another example of a ground pad opening.

(1) Although the embodiment described above has shown an example in which the first openings 11A, the second opening 13A, and the dielectric opening 12A have square shapes in a plan view and the ground pad openings 11B and the power supply pad openings 13B have cross shapes in a plan view, this is not intended to impose any limitation. For example, the ground pad openings 11B and the power supply pad openings 13B may be simply rectangular as shown in FIG. 12 or may be shaped as shown in FIG. 13. Further, the first openings 11A, the second opening 13A, and the dielectric opening 12A may for example have circular shapes in a plan view.

(2) Although the embodiment described above has shown an example in which the electric conducting material is constituted by the copper paste 4, this is not intended to impose any limitation. The electric conducting material may be constituted, for example, by plated copper.

(3) Although the embodiment described above has shown an example in which the ground electrode 11 (first sheet electrode) and the power supply electrode 13 (second sheet electrode) serve as lower and upper electrodes, respectively, in FIG. 1, this is not intended to impose any limitation and the opposite may be true. That is, the power supply electrode 13 (second sheet electrode) and the ground electrode 11 (first sheet electrode) may serve as lower and upper electrodes, respectively, in FIG. 1.

Figure 14:
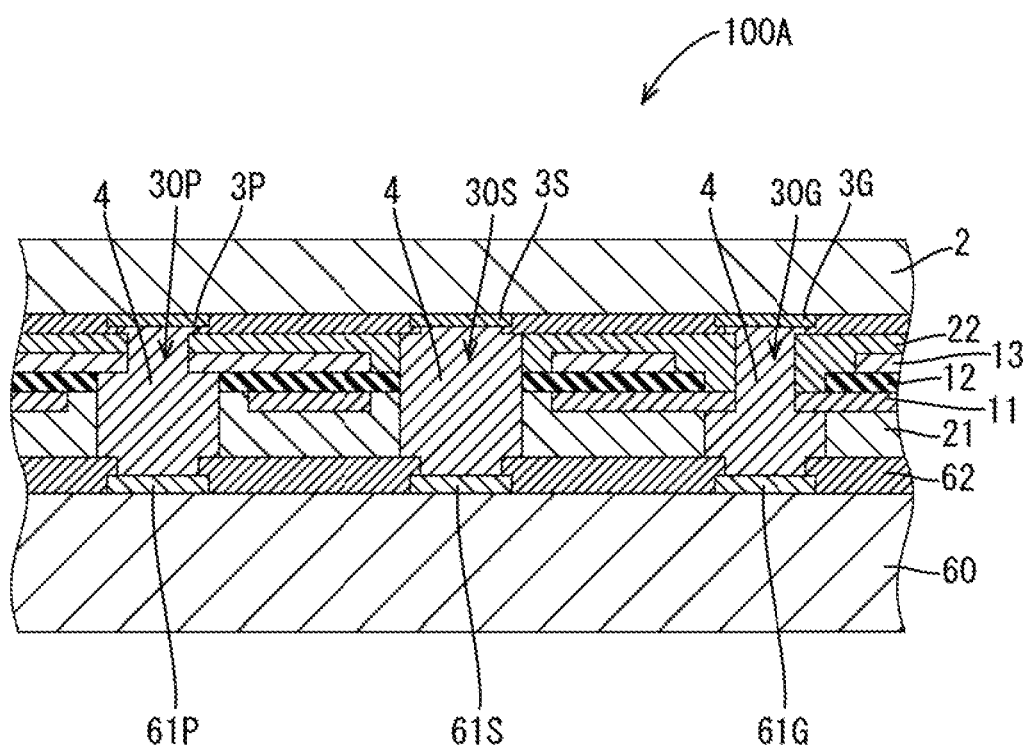
FIG. 14 is a schematic partial cross-sectional view showing another example of a semiconductor device.

(4) A configuration of the semiconductor device 100 is not limited to that shown in FIG. 1. For example, as shown in FIG. 14, a semiconductor device 100A may be configured to include an interposer substrate (intermediate substrate) 60 provided on a side of the thin-film capacitor structure 50 opposite to the electrode pad surface 2S. On top of the interposer substrate 60, intermediate substrate pads 61P, intermediate substrate pads 61G, and intermediate substrate pads 61S are formed in positions corresponding to the power supply pads 3P, the ground pads 3G, and the signal pads 3S, and an insulating layer 62 that insulates and isolates each of the intermediate pads 61 is formed. This configuration makes it possible to change the pitch between electrode pads 3 of the LSI chip 2 by providing the intermediate substrate 60 with a rewiring layer. This makes it possible to connect the semiconductor device 100A to an external circuit board with an electrode pitch that is different from the electrode pitch of the LSI chip 2, e.g. to a motherboard. It should be noted that FIG. 14 and the like omit to illustrate other internal components, such as the rewiring layer, of the interposer substrate 60.

Figure 15:
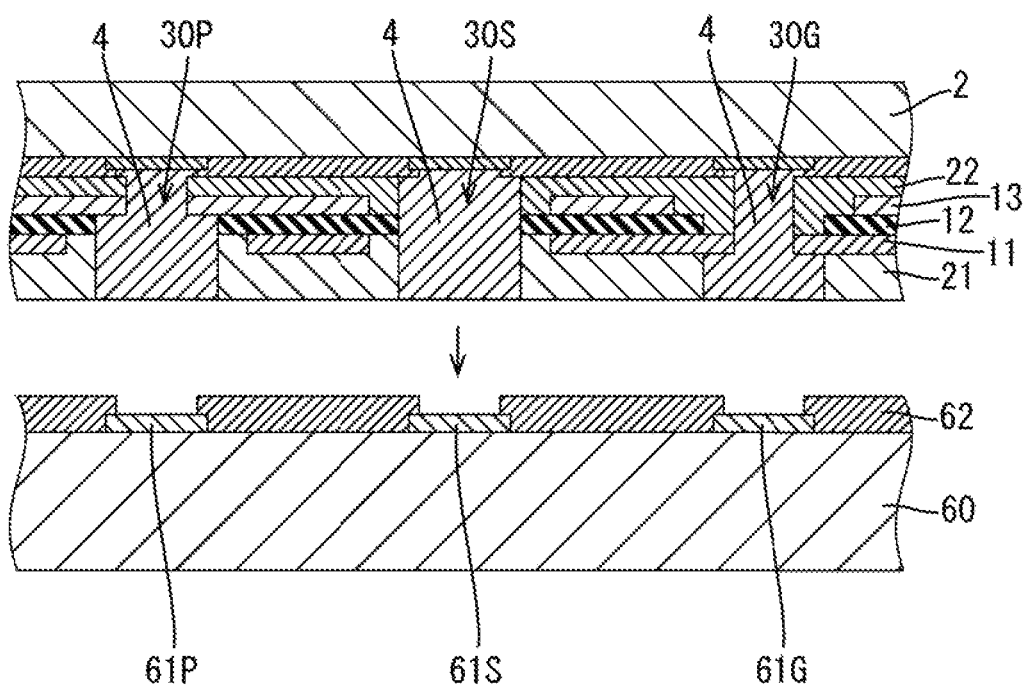
FIG. 15 is a partial cross-sectional view showing a method for manufacturing the semiconductor device of FIG. 14.
Figure 16:
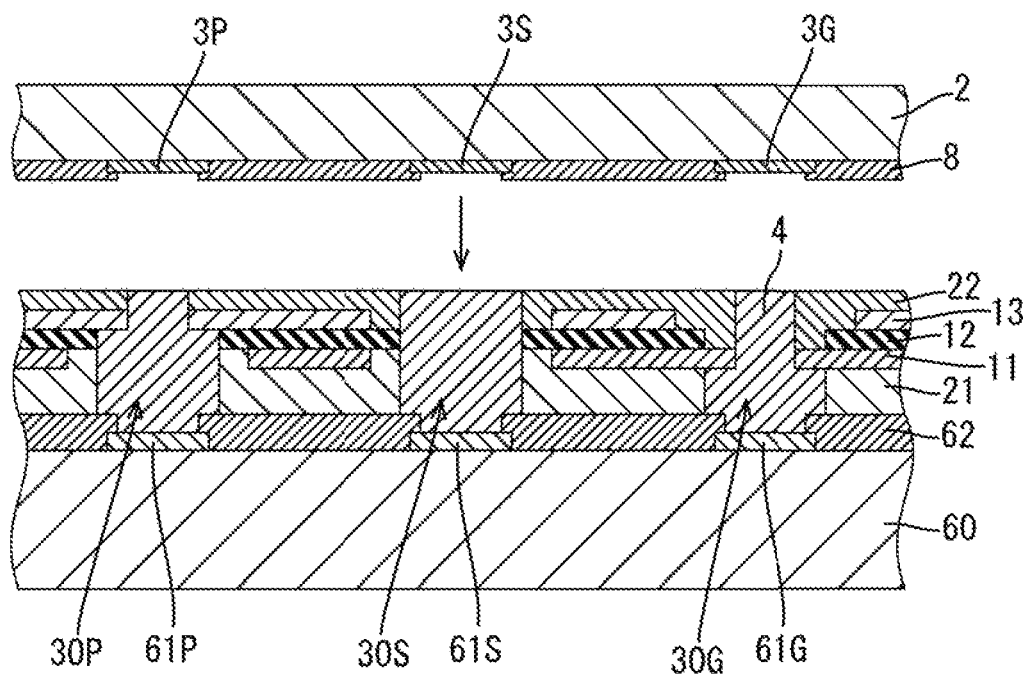
FIG. 16 is a partial cross-sectional view showing another method for manufacturing the semiconductor device of FIG. 14.

In the case of a configuration including the interposer substrate 60, a connection between the LSI chip 2 and the interposer substrate 60 is made by, as shown in FIG. 15, connecting the thin-film capacitor structure 50 to the LSI chip 2 via the copper paste 4 or the like first and then connecting the thin-film capacitor structure 50 to the interposer substrate 60 by thermocompression bonding. Alternatively, as shown in FIG. 16, the thin-film capacitor structure 50 may be connected to the interposer substrate 60 via the copper paste 4 or the like first and then connected to the LSI chip 2 by thermocompression bonding.

EXPLANATION OF SYMBOLS

2: LSI chip (integrated circuit)
2S: Electrode pad surface
3G: Ground pad (electrode pad)
3P: Power supply pad (electrode pad)
3S: Signal pad (electrode pad)
5: External connection pad
10: Thin-film capacitor
11: Ground electrode (first sheet electrode)
11A: First opening
11B: Ground pad opening
11C: Overhang (first overhang)
12: Thin-film dielectric layer
13: Power supply electrode
13A: Second opening
13B: Power supply opening
13C: Overhang (second overhang)
30G: Ground through hole
30P: Power supply through hole
30S: Signal through hole
50: Thin-film capacitor structure
60: Interposer substrate
61: Intermediate substrate pad
100, 100A: Semiconductor device

The invention claimed is:

1. A thin-film capacitor structure that is joined to an electrode pad surface of an area array integrated circuit having a plurality of electrode pads, arranged in an area array in the electrode pad surface, that include power supply pads, ground pads, and signal pads,
the thin-film capacitor structure comprising:
a thin-film capacitor including a first sheet electrode, a second sheet electrode, and a thin-film dielectric layer formed between the first sheet electrode and the second sheet electrode;
a first insulating film that insulates the first sheet electrode;
a second insulating film that insulates the second sheet electrode; and
a plurality of through holes, bored from the first insulating film to the second insulating film through the thin-film capacitor and formed in positions corresponding to the plurality of electrode pads, that include power supply through holes formed in positions corresponding to the power supply pads, ground through holes formed in positions corresponding to the ground pads, and signal through holes formed in positions corresponding to the signal pads, wherein
the first sheet electrode includes
first overhangs that hang over the ground through holes,
first openings formed in positions corresponding to the power supply pads and the signal pads, and
ground pad openings, formed in positions corresponding to the ground pads, that have therearound planar shapes forming the first overhangs, and
the second sheet electrode includes
second overhangs that hang over the power supply through holes,
second openings formed in positions corresponding to the ground pads and the signal pads, and
power supply pad openings, formed in positions corresponding to the power supply pads, that have therearound planar shapes forming the second overhangs.

2. The thin-film capacitor structure according to claim 1, wherein
the thin-film dielectric layer includes dielectric openings, formed in positions corresponding to the plurality of electrode pads, that have opening areas which are smaller than those of the first openings and the second openings, the first insulating film includes first insulating film openings formed in positions corresponding to the plurality of electrode pads, the second insulating film includes second insulating film openings formed in positions corresponding to the plurality of electrode pads, each of the power supply through holes is constituted by a corresponding one of the first insulating film openings, a corresponding one of the dielectric openings, a corresponding one of the power supply pad openings, and a corresponding one of the second insulating film openings, each of the ground through holes is constituted by a corresponding one of the first insulating film openings, a corresponding one of the ground pad openings, and a corresponding one of the second insulating film openings, and each of the signal through holes is constituted by a corresponding one of the first insulating film openings, a corresponding one of the dielectric openings, and a corresponding one of the second insulating film openings.

3. The thin-film capacitor structure according to claim 2, wherein the first openings, the second openings, and the dielectric openings have square shapes in a plan view, and the power supply pad openings and the ground pad openings have cross shapes in a plan view.

4. A semiconductor device comprising:
an area array integrated circuit having a plurality of electrode pads;
a thin-film capacitor structure according to claim 1, the thin-film capacitor structure being joined to an electrode pad surface of the area array integrated circuit; and
an electric conducting material filling the power supply through holes, the ground through holes, and the signal through holes up to the plurality of electrode pads.

5. The semiconductor device according to claim 4, further comprising connection pads for use in external connection, the connection pads being provided on a side of the electric conducting material opposite to the plurality of electrode pads.

6. The semiconductor device according to claim 4, further comprising an intermediate substrate, provided on a side of the thin-film capacitor structure opposite to the electrode pad surface, that has a plurality of intermediate substrate pads in positions corresponding to the plurality of electrode pads.

* * * * *